US008968535B2

(12) United States Patent
MacNeil et al.

(10) Patent No.: US 8,968,535 B2
(45) Date of Patent: Mar. 3, 2015

(54) ION BEAM SOURCE (75) Inventors: John MacNeil, Vale of Glamorgan (GB); Paul George Bennett, Bristol (GB)

(73) Assignee: SPP Process Technology Systems UK Limited, Newport, Gwent (GB)

( * ) Notice: Subject to any disclaimer, the term of this patent is extended or adjusted under 35 U.S.C. 154(b) by 288 days.

(21) Appl. No.: 12/967,304

(22) Filed: Dec. 14, 2010

(65) Prior Publication Data

US 2011/0139605 A1 Jun. 16, 2011

Related U.S. Application Data (60) Provisional application No. 61/286,060, filed on Dec. 14, 2009.

(51) Int. Cl.
| | | |
|---|---|---|
| C23C 14/00 | (2006.01) | |
| C25B 11/00 | (2006.01) | |
| C25B 13/00 | (2006.01) | |
| H01J 27/02 | (2006.01) | |
| C23C 14/34 | (2006.01) | |
| C23C 14/46 | (2006.01) | |
| H01J 37/24 | (2006.01) | |
| H01J 37/305 | (2006.01) | |

(52) U.S. Cl.
CPC ........... *H01J 27/022* (2013.01); *C23C 14/3485* (2013.01); *C23C 14/46* (2013.01); *H01J 37/243* (2013.01); *H01J 37/305* (2013.01); *H01J 2237/004* (2013.01); *H01J 2237/043* (2013.01); *H01J 2237/08* (2013.01); *H01J 2237/304* (2013.01)
USPC ................................. 204/298.08; 204/298.04

(58) Field of Classification Search
CPC .. C23C 14/3485; C23C 14/46; H01J 2237/08
USPC ........................................ 204/298.08, 298.04
See application file for complete search history.

(56) References Cited

U.S. PATENT DOCUMENTS

| | | | | |
|---|---|---|---|---|
| 3,472,751 | A * | 10/1969 | King | 204/192.11 |
| 4,902,394 | A * | 2/1990 | Kenmotsu et al. | 204/192.12 |
| 5,969,470 | A * | 10/1999 | Druz et al. | 313/359.1 |
| 6,024,844 | A * | 2/2000 | Drummond et al. | 204/192.12 |
| 2004/0075060 | A1* | 4/2004 | Luten et al. | 250/423 R |
| 2005/0214478 | A1* | 9/2005 | Hanawa et al. | 427/569 |
| 2007/0008744 | A1 | 1/2007 | Heo et al. | |
| 2008/0187781 | A1 | 8/2008 | Cheng et al. | |

FOREIGN PATENT DOCUMENTS

| | | |
|---|---|---|
| JP | 5-331634 | 12/1993 |
| JP | 6-165510 | 6/1994 |

(Continued)

OTHER PUBLICATIONS

Chinese Office Action Dated Jul. 3, 2014.

(Continued)

*Primary Examiner* — Keith Hendricks
*Assistant Examiner* — Ibrahime A Abraham
(74) *Attorney, Agent, or Firm* — Volentine & Whitt, PLLC (57) ABSTRACT

This invention relates an ion beam source (10) for use with a non-electrical conducting target (14) including a grid (13) for extracting ions and a power supply for supplying pass power to the grid (13) to extract the ions.

8 Claims, 6 Drawing Sheets

(56) References Cited

FOREIGN PATENT DOCUMENTS

| | | |
|---|---|---|
| JP | 6-262446 | 9/1994 |
| JP | H8036982 | 2/1996 |
| JP | 2002-143094 | 5/2002 |
| JP | 2003-129237 | 5/2003 |
| JP | 2007-52941 | 3/2007 |
| JP | 2007052941 | 3/2007 |
| WO | WO 2008009898 A1 * | 1/2008 .............. H01J 27/18 |
| WO | 2009/008449 A1 | 1/2009 |

OTHER PUBLICATIONS

Korean Office Action Dated May 30, 2014.
Japanese Office Action Dated September 16, 2014 for Related Japanese Patent Application No. 2010-278096.
Chinese Office Acted for Related Chinese Application No. 2010105930884.

* cited by examiner

First 100uS normal switching. At approx 128uS arc detected

ION BEAM SOURCE

This invention relates to an ion beam source and a method of operating such a source.

Ion beam deposition systems are well-suited for the deposition of metals as the conductive metal target provides an excellent electrical and thermal path avoiding any charging or thermal issues.

Such systems can be used for the deposition of insulating materials, but the target then can become quickly charged due to positive flux of ions incident on its surface. This frequently results in arcing, which typically takes place within the source.

The historical solution has been to provide a secondary source of electrons such as a hot wire, which provides thermionic emission of electrons or a plasma source such as a Kaufman cell, hollow cathode or an inductively coupled plasma.

Whilst such arrangements have been operational for some decades, there are a number of problems. In particular they each have to be installed within the vacuum system which can interfere with the ion source, target and substrate operations. The hot wire technique can create contamination, can be unreliable due to thermal expansion and contraction and can only operate in an inert vacuum ambient. The plasma sources all have cost, thermal management and potential contamination concerns.

From one aspect, the invention consists in an ion beam source for use with a non-electrical conducting target including a grid for extracting ions and a power supply for supplying pulsed power to the grid to extract the ions.

The Applicants have appreciated that by pulsing the beam, the stream of positive ions to the insulating target is stopped for a short period of time. This provides sufficient time for electrons generated in the ion source and/or chamber plasma to neutralise sufficiently, and have substantially discharge, the target. "Substantially discharged" for the purposes of this specification is the discharge necessary to allow the target to function over the sputter period without arcing. Provided there is sufficient potential difference between the ions leaving the source and the target for practical operation, some charge build-up on the target can be accepted.

In the preferred embodiment the power supply includes a DC supply, a power switch for connecting and interrupting supply of power to the grid and a pulse generator for switching the power switch. Alternatively, the power supply for switching the power to the grid may switch the grid between the DC supply voltage and ground.

In this latter case, the circuit may include a first FET connected between a DC supply voltage rail and a midpoint, a second FET connected between the midpoint and ground, a pair of diodes connected with each other and in parallel with the respective FET, an inductor connected to the midpoint and to a capacitance associated with the grid and a pulse generator for turning on the FETs alternately, whereby the circuit will substantially retain the grid and rail voltage when an FET is switched on and collapse the grid to ground when the FETs are switched off.

A detector for detecting an arc-generated current surge and for generating a temporary inhibit signal to maintain temporarily the grid at ground may be provided.

The detector may detect the change in the current and/or the rate of change in voltage in the grid supply and compare it with the reference or references. The detector may be in the form of a transformer.

Additionally the invention includes a half-bridge DC power source having an output including a first FET for connection between a DC supply voltage rail and a midpoint, a second FET connected between the midpoint and ground, a pair of diodes connected in series and in parallel with their respective FET, an inductor connected to the midpoint and to a capacitance associated with the output and the pulse generator for turning on the FETs alternately, whereby the circuit will substantially retain the output at rail voltage when an FET is switched on and collapse the output to ground voltage when the FETs are switched off.

The source may further include a detector for detecting a current surge at the output and for generating a temporary inhibit signal to maintain temporarily the output at ground. The detector may detect the change of current and/or the rate of change voltage at the output and compare it with a reference or references. The detector may include a transformer.

Although the invention has been defined above it is to be understood that it includes any inventive combination of the features set out above or in the following description.

The invention may be performed in various ways and specific embodiments will now be disclosed, by way of example, with reference to the accompanying drawings, in which.

Figure 1:
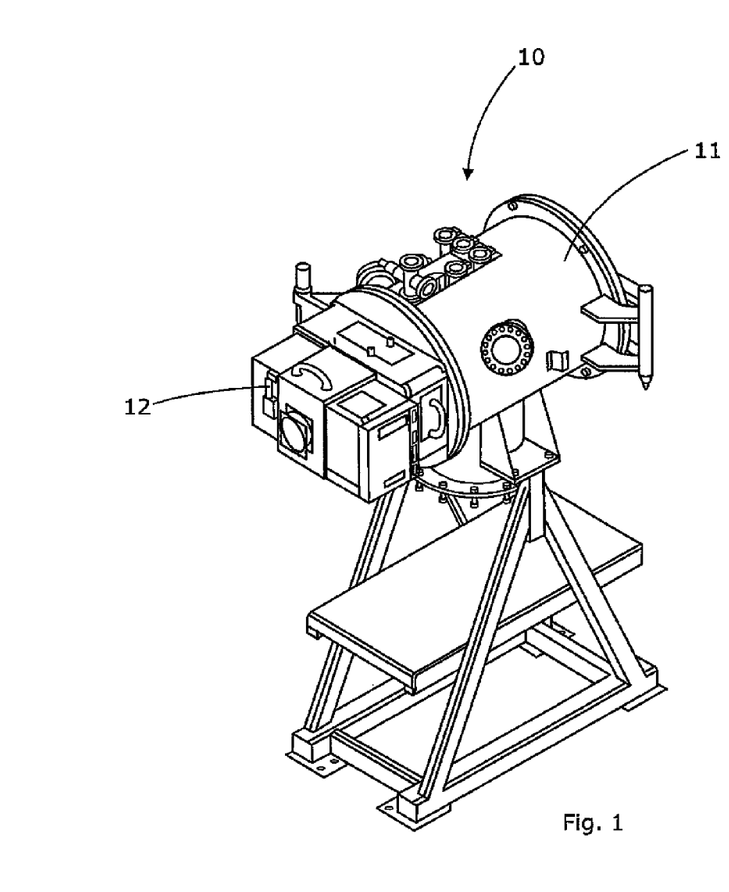
FIG. 1 is a perspective view of a test rig.
Figure 2:
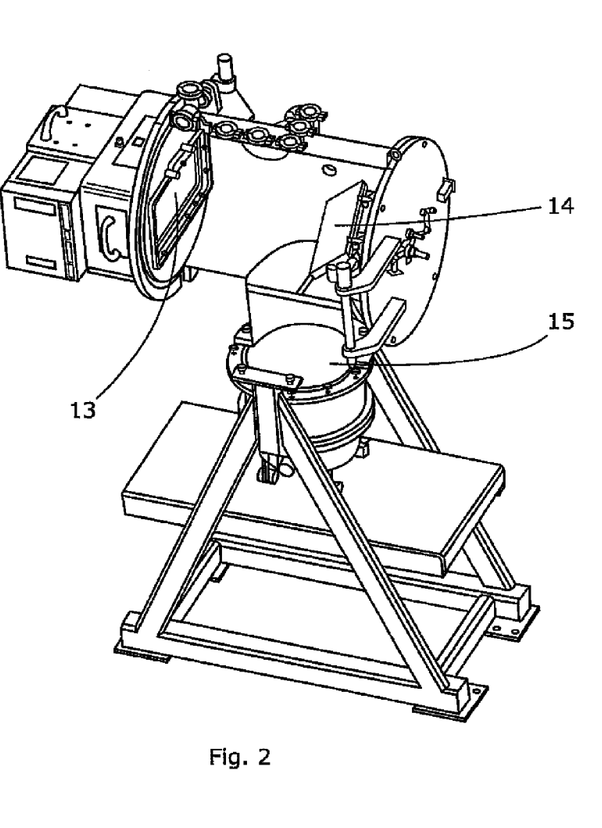
FIG. 2 is a partially cut-away view of the rig of FIG. 1.

In FIGS. 1 and 2 a test rig generally indicated at 10 includes a vacuum chamber 11 and an ion source 12. The ion source 12 is, in this case, a broad beam ion source which emits a beam of ions from the grid 13 to a tilted target 14 causing target material to be deposited on a wafer (not shown) at top of chamber 11. The ion source can be of the type described in WO-A-2008/009898, the contents which are incorporated herein by reference. In that construction the accelerator grid 13 is formed by four individual grids, one of which is maintained at a positive voltage to act as a source of ions, whilst the other grids are maintained at a negative voltage or ground in order to project the generated ions at a beam.

Figure 3:
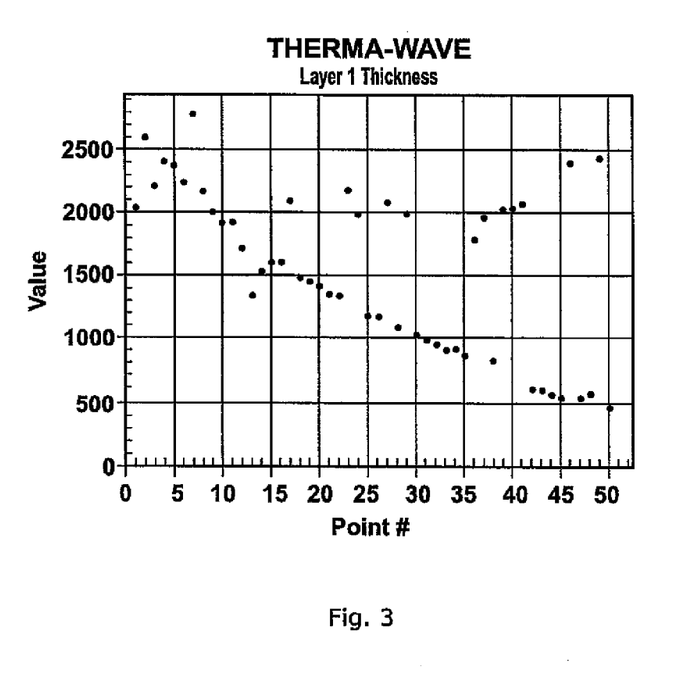
FIG. 3 is a plot of SiO2 film thickness in Å (Y axis) vs position on Si wafer (X axis) using the rig of FIGS. 1 and 2.
Figure 4:
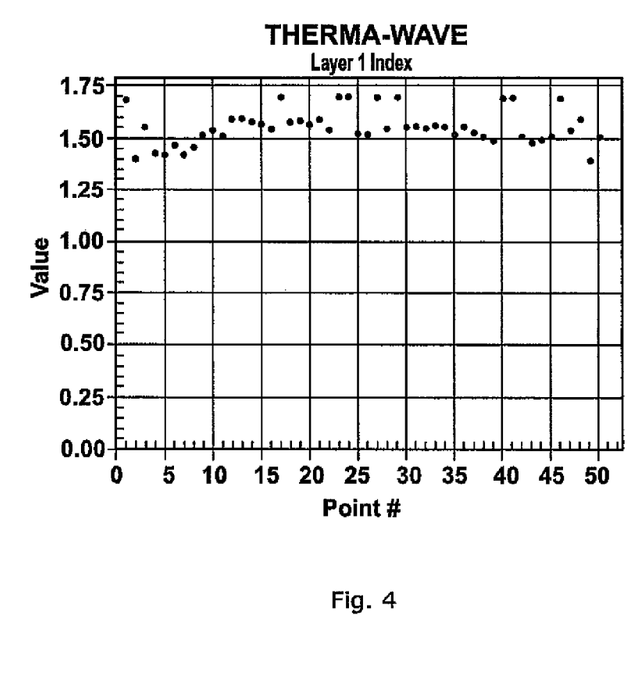
FIG. 4 is a corresponding plot of refractive index of the n of the SiO2 film (Y axis) vs opposition on Si wafer (X axis)

FIG. 3 illustrates the thickness in Å of the SiO2 layer deposited across on Si wafer using the apparatus with a 3 mm thick insulating SiO2 target. The first point to note is that the layer has a thickness. If there had been charge build-up, the beam would have been killed by arcing almost immediately and no deposition would have occurred. The general trend shown by the points is an inclined thickness on the wafer, which corresponds with the inclination of the target. The high points, which do not follow the general reduction in thickness travel across the wafer are due to dust. This is believed to be due to the fact that the prototype equipment was situated in a "dusty" area and not in a "clean" room. In FIG. 4, the refractive index across the wafer is shown and this is fairly consistently around 1.5 which is appropriate for the film deposited. These results therefore show that a pulsed ion beam is usable with an insulating target for deposition of that target material, without the need for any secondary source of electrons.

Figure 5:
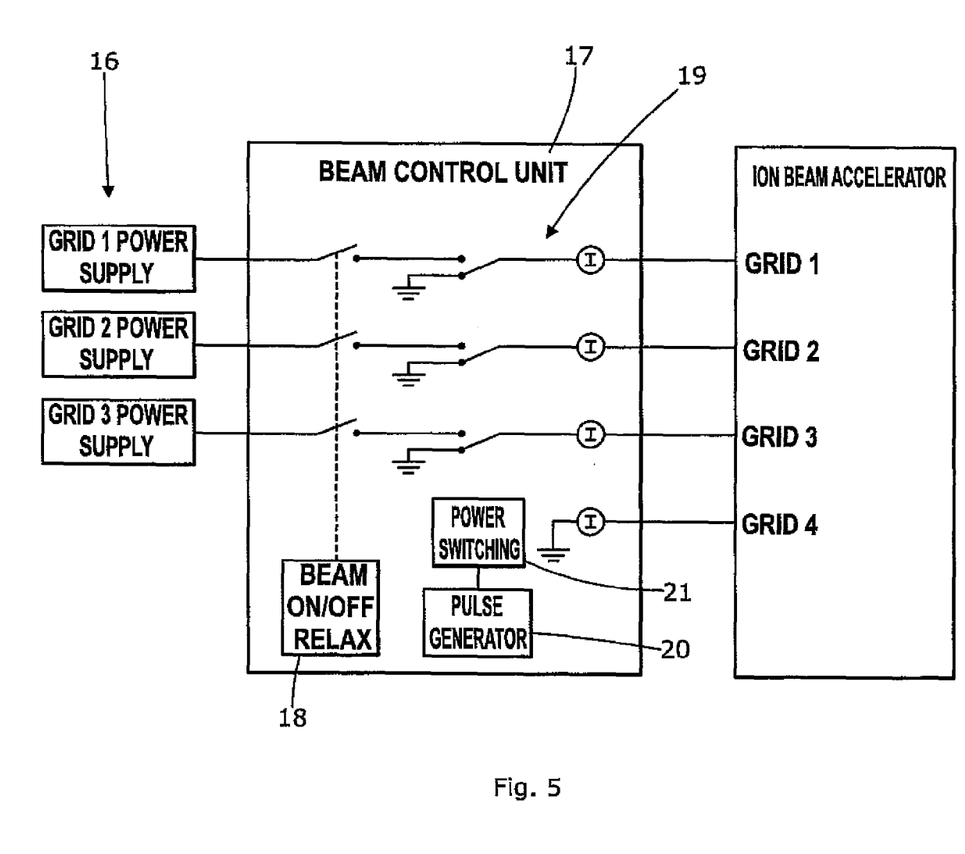
FIG. 5 is a schematic view of a pulsed power source for use with an ion beam source.

FIG. 5 illustrates a schematic layout for a suitable power supply. The grids marked GRD1, GRD2, GRD3 and GRD4 correspond to the grids mentioned above. Respective power supplies generally indicated at 16 are connected to each of GRD 1 to 3, whilst GRD 4 is earthed. In the beam control unit 17 a relay 18 is provided for disconnecting all the power supplies.

A further set of switches is shown at 19 which can be switched between earth and the power supply rail voltage in response to a pulse generator 20 which controls a power switching arrangement 21.

With the ion source 12 under consideration, the design of the power switching has to be carefully considered because it needs to be able to handle up to 1600 volts.

Thus, ions are initially generated in an inductively coupled plasma. The grids extract the ions and columnate them into a beam. The first grid (GRD1) extracts the ions by floating the grid and inductively coupled plasma assembly up to 1600 volts positive with respect to ground. The ions therefore see a negative potential to pull them through the grid. The next two grids (GRD2 and GRD3) are biased negative with respect to ground to further pull the ions through. The final grid (GRD4) is grounded. All the beam power comes from the first grid supply which can provide up to 0.5 amps or more. At the typical maximum GRD1 voltage of 1600 volts, GRD2 and GRD3 are biased at −350 and −75 volts respectively. To regulate the beam to a current set point and fixed voltage, the ICP RF power is adjusted to a closed-loop control system. This measures the GRD1 current at the return of the power supply.

Figure 6:
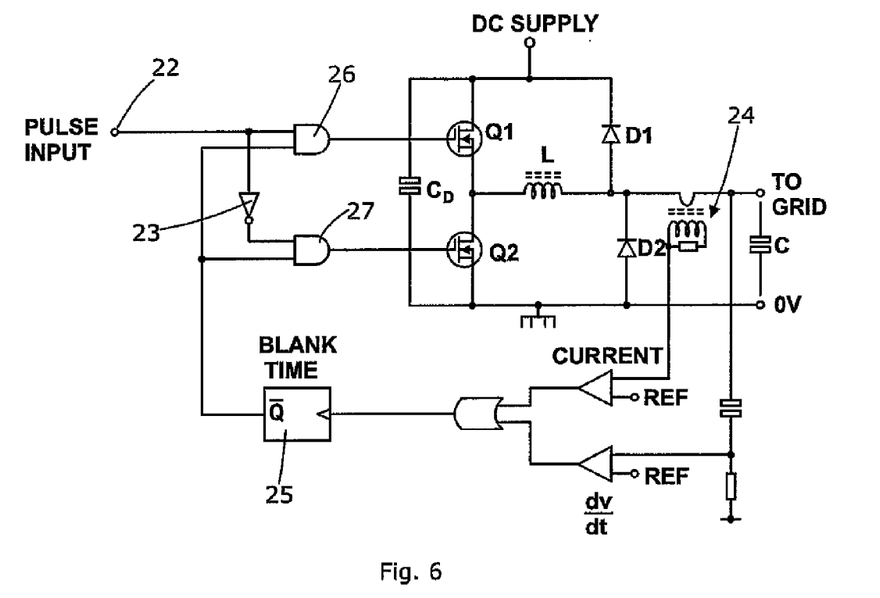
FIG. 6 is a detailed circuit of an alternative form of power source.

FIG. 6 illustrates the basic ion beam pulser circuit for GRD1, which also includes means of arc-detection and resonant transitions. The lower voltages/powers associated with GRD2 and GRD3 could also use a resonant circuit or just limited capacitive charging with a resistor. In one arrangement GRD2 has the resonant circuit and GRD3 is a 50 ohm resistor. In FIG. 6 the resonance circuit is formed between an inductor L and a grid capacitance C. This enables the grid to charge and discharge efficiently without the resistive charging $P=fCV^2$ power loss.

When FET Q1 turns on the grid capacitance C is charged through inductance L. When the grid voltage grid reaches the supply voltage, resonant action with capacitance C tries to continue the voltage rise but is prevented from doing so by the diode D1. Current is therefore now trapped in the inductance L with just the voltage drop of Q1, D1 and its resistance across it. Current therefore decays only slowly, remaining close to the peak charging value. When Q1 turns off, the current can decay much more quickly forcing the junction of Q1/Q2 negative and it becomes clamped to 0 volts by the Q2 body diode. Shortly after this, Q2 is turned on. Once the current has decayed to zero, it then reverses and starts to build up again now discharging the grid capacitance. Again, a resonant transition takes place and once more current is trapped in L but now in the opposite direction clamped by Q2/D2. The cycle continues when Q2 is turned off and Q1 once again turned on.

The FETs Q1 and Q2 are switched on and off by pulses at the pulse input 22. The pulses reaching FET Q2 are out of phase to those reaching FET Q1 due to the inverter 23.

The circuit efficiently charges and discharges the grid capacitance, recycling the energy stored in inductance L. The transitions on the grid are "soft" so is electric magnetic interference and the speed requirement of D1/D2. Also current commutes in Q1 to Q2 from the same device body diode to FET (same). Therefore there is no forced diode recovery and switching is sufficient with low electro-magnetic interference. The penalty is the circulating current is typically in order of magnitude higher than the beam current so Q1, Q2, D1, D2 and L need to be sized for this current.

Protection is provided for both over-current and excessive dV/dt. The output current is sensed by current transformer indicated at 24. The transformer output is compared to a reference limit. If an over-current is detected a mono-stable 25 is triggered to give a blank period when pulsing stops. It achieves this by changing an input on each of the respective end gates 26, 27 which feed the pulses to Q1 and Q2 respectively. Both Q1 and Q2 are turned off for the duration of the blank period. Similarly if an excessive fall, e.g. negative, dV/dt is detected, a blank period will be initiated.

Typically, when an arc occurs current starts to rise. The arc current quickly escalates to an abnormally high value. When this exceeds the value stored in L, the output voltage falls and the grid capacitance is discharged. This will usually happen much faster than the normal off transitions, so it is detected by the dV/dt circuit. The action of L limits the rise of current from the circuit, so usually the system has detected the arc before over-current occurs.

When the arc is detected, Q1 is turned off so the junction of Q1/Q2 is clamped by the Q2 body diode. L then discharges through the Q2 body diode and the arc. The arc voltage is approximately constant at around 100 volts, so the current discharge is linearly in about 12 μs. Energy delivered to the arc is the sum of the grid capacitance and the L stored energy. These energies are approximately equal due to the resonant action:

$E=0.5CV^2+0.5LI^2$ and for a recognisable event: C=3500 pF, L=500 μH V=800V and I=2 A. Therefore E=1.12+1 which equals 2 mJ. The energy is proportional to both current and voltage squared so at a full system voltage of 1600 volts, arc energy would be approximately 8 mJ.

Figure 7:
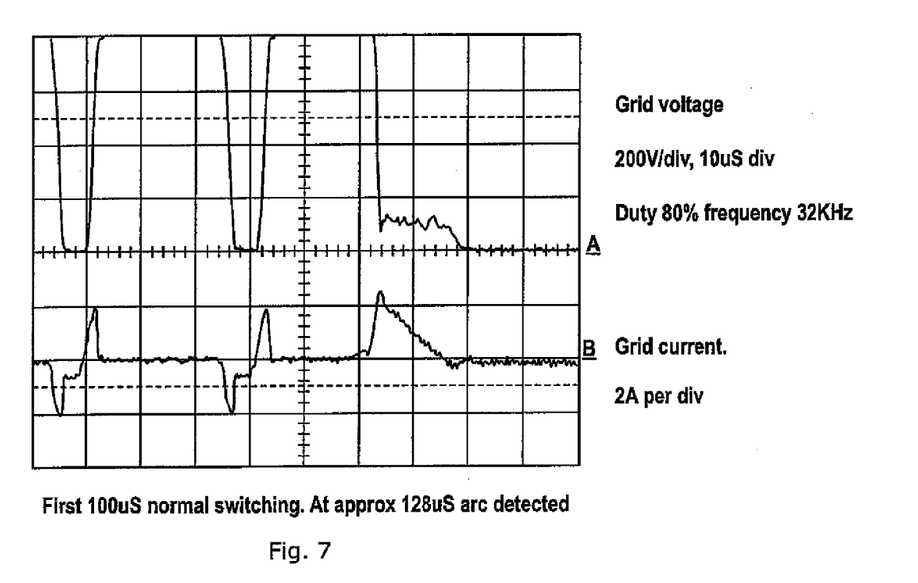
FIG. 7 is a test plot for current and voltage for the source of FIG. 6.

Such an event is illustrated in FIG. 7. The GRD1 current is measured using the current transformer. This therefore does not transmit the DC levels. The actual beam current is the difference between the two settled levels between the switching transitions. This is both the positive beam on ion current and electron current when the beam is forced off. The current is approximately 0.5 amps in the scope trace.

Ion beam current regulation is achieved as normal with plasma source RF power being adjusted. Current is sensed in the DC supply. Power supply units response, output capacitance and circuit de-coupling capacitance $C_D$ mean that it simply senses average current. It does not see the pulsing. Further, with a sufficiently short arc blanking time and low enough arc rate, it is not affected by arcs either. Arc blank time is set to 100 μs. An arc rate of 1 Hz would result in just 0.01% deposition time lost.

Figure 8:
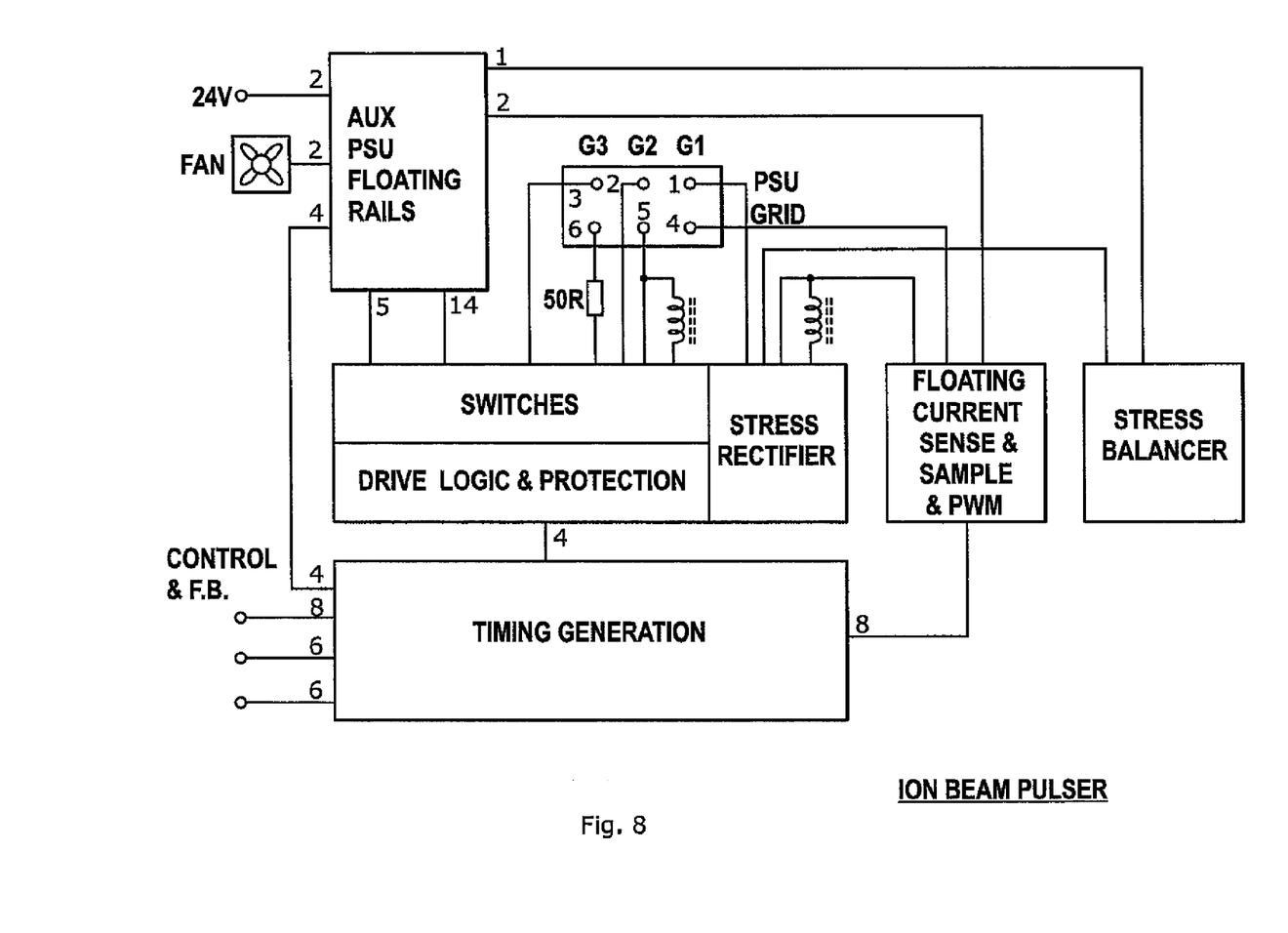
FIG. 8 illustrates a block diagram of the an ion beam pulser circuit.

In FIG. 8 which represents a block diagram of the basis components associated with constructing 19, 20 and 21 of FIG. 5 the supply at the top left hand corner is the 24 volt housekeeping supply which, with linear regulators, provides 15 and 5 volts for the signal electronics. A separate 15 volts is provided to perform the floating rail converter, this provides 8 floating rails for bridge drivers and the floating GRD1 current monitor. Failure indication is provided by an LED across a resistor in series with the 15 volt regulator. Switching device failure inevitably causes gates or shorts which increase the load on the converter and hence illuminate the LED. The converter itself is based on a self-oscillating half bridge driver. The transformer voltages are clamped to the 15V supply rail so that the outputs are semi regulated. Secondaries are half wave rectified. Four outputs are phased opposite to the other four to give an approximately symmetrical load. In the centre are the bridges, drivers and protection logic. The grids are also illustrated. For protection, GRD1 current is sensed by a 500:1 current transformer. A basic timing function is provided by an 8 MHz quartz clock module from which various basic clock frequencies can be derived.

Figure 9:
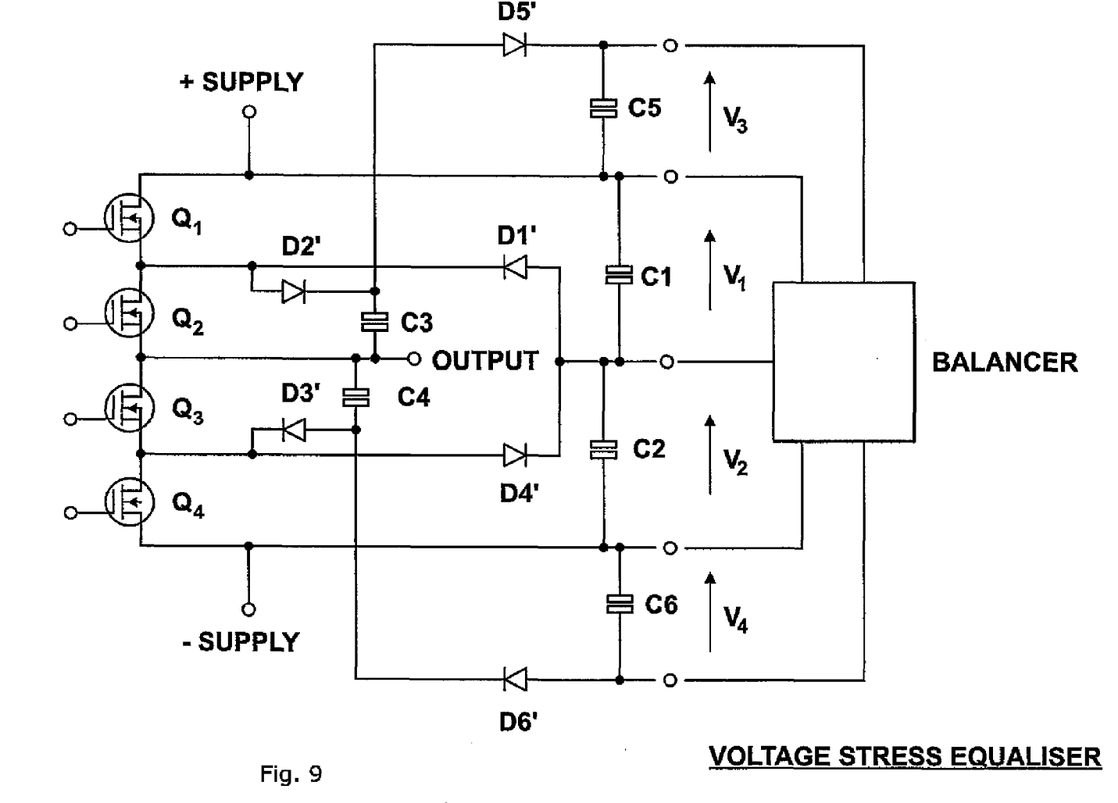
FIG. 9 is a circuit of a half bridge configured as a voltage stress equaliser.

To achieve stable operation at above 1200V, the standard breakdown limit for most power devices, the circuit employs a voltage stress balancer for series connected power transistors as can be seen in FIG. 9 where a half bridge incorporating 2 series connected devices (example FETs). Q1-Q4 form the half bridge with two transistors Q1/2 and Q3/4 in each "switch position". So Q1/2 are on together and Q3/4 are on together. Detail of the balancer is not shown, it just maintains V1=V2=V3=V4 cycling charge between C1, 2, 5 and 6 as necessary.

If when Q1/2 are off the voltage across Q1 exceeds half the supply voltage then D1' will conduct directing charge into C1 therefore limiting the voltage across Q1 to half the supply rail. Similarly for Q4 via D4 into C2 for the lower half of the bridge. If when Q1/2 are off the voltage across Q2 exceeds half the supply voltage, the voltage across C3 will rise above half the supply voltage. When Q1 and Q2 are next on, the voltage across C3 is then transferred from C3 via D5 into C5. As C5 is held at half the supply voltage, therefore so will the voltage across C3 and hence the voltage across Q2 when off. D3', C4, D6' and C6 perform the complementary function to protect Q3.

The output of the bridge maybe a square wave, pulse wave modulation (PWM) waveform or other waveform where Q1/2 and Q3/4 alternately switch fully on or off. Balancing currents/energies are typically small compared to the main power through put, so relatively small and cheap components can be applied.

Although particularly suited to providing pulsed power supply to an ion beam source, as described above, however, the circuit may have many other applications particularly where reasonably high voltages have to be handled. The invention therefore includes the circuit per se as well as its use in the context of an ion beam source for ion beam sputtering. It will also be noted that unusually the circuits of the invention can be used to provide three or more readily synchronised pulsed outputs by having a circuit for each grid or output and a common source of clock pulses The invention also includes a method of sputtering a non-electrically conducting target including the steps of irradiating a target with an ion beam source and pulsing the power supply to the ion beam source.

The invention claimed is:
1. Sputtering apparatus comprising:
a non-electrical conducting target;
an ion beam source that produces ions, the ion beam source including at least one grid which when supplied with power emits a beam of the ions, and wherein the target and the ion beam source are disposed in the apparatus relative to each other such that the beam of ions emitted by the grid propagates along a path in the apparatus extending to the target, whereby the target is sputtered by the beam of ions; and
a power supply system operatively connected to the grid and configured to supply pulses of power to the grid such that the ion beam source emits pulses of the beam toward the target, and such that the pulses of power are of a duration which are sufficient to allow the target to be substantially discharged when the pulse is off,
wherein the power supply system includes a circuit configured to switch the apparatus between a first state at which the grid is connected to a DC power supply voltage so that the grid receives DC power and a second state at which the grid is connected to ground, and
the circuit comprises a first FET connected between a DC supply voltage rail and a midpoint, a second FET connected between the midpoint and ground, a pair of diodes connected in series and in parallel with a respective FET, an inductor connected to the midpoint and to a capacitance associated with the grid, and a pulse generator for turning on the FETs alternately, whereby the circuit will substantially retain the grid at rail voltage when a FET is switched on and collapse the grid to ground voltage when the FETs are switched off.

2. Sputtering apparatus as claimed in claim 1 wherein the circuit further includes a detector that detects an arc generated current surge in the circuit and in response to the surge generates a temporary inhibit signal to maintain temporarily the grid at ground.

3. Sputtering apparatus as claimed in claim 2 wherein the detector is configured to detect the rate of change of current and/or voltage supplied to the grid and compare it with a reference or references.

4. An ion beam source as claimed in claim 3 wherein the detector includes a transformer.

5. Sputtering apparatus as claimed in claim 1 wherein the at least one grid comprises a plurality of discrete grids disposed adjacent one another in the ion beam source, and the power supply system includes a plurality of power sources associated with the grids, respectively, such that each of the grids is supplied power by a respective one of the sources, and the pulse generator is a common pulse generator associated with the grids and power sources.

6. Sputtering apparatus as claimed in claim 1 wherein the power supply system further includes a detector that detects a current surge at an output of the system and in response to the surge generates a temporary inhibit signal to maintain temporarily the output at ground.

7. Sputtering apparatus as claimed in claim 6 wherein the detector is configured to detect the rate of change of current and/or voltage at the output and compare it with a reference or references.

8. Sputtering apparatus as claimed in claim 6 wherein the detector includes a transformer.

* * * * *